US011832469B2

(12) United States Patent
Song

(10) Patent No.: US 11,832,469 B2
(45) Date of Patent: Nov. 28, 2023

(54) DISPLAY SUBSTRATE, METHOD FOR MANUFACTURING DISPLAY SUBSTRATE, AND DISPLAY APPARATUS

(71) Applicant: BOE TECHNOLOGY GROUP CO., LTD., Beijing (CN)

(72) Inventor: Wenfeng Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 469 days.

(21) Appl. No.: 16/765,592

(22) PCT Filed: Jun. 24, 2019

(86) PCT No.: PCT/CN2019/092536
§ 371 (c)(1),
(2) Date: May 20, 2020

(87) PCT Pub. No.: WO2020/257971
PCT Pub. Date: Dec. 30, 2020

(65) Prior Publication Data
US 2021/0408442 A1 Dec. 30, 2021

(51) Int. Cl.
*H10K 50/828* (2023.01)
*H10K 50/818* (2023.01)
(Continued)

(52) U.S. Cl.
CPC ......... *H10K 50/828* (2023.02); *H10K 50/818* (2023.02); *H10K 50/858* (2023.02);
(Continued)

(58) Field of Classification Search
None
See application file for complete search history.

(56) References Cited

U.S. PATENT DOCUMENTS

2007/0046195 A1* 3/2007 Chin .................... H10K 50/125 313/506
2009/0236624 A1 9/2009 Shin
(Continued)

FOREIGN PATENT DOCUMENTS

CN 101540377 A 9/2009
CN 101661951 A 3/2010
(Continued)

OTHER PUBLICATIONS

"Optical properties of thin PMMA films for sensor application" by Atanasova et al. (Year: 2015).*
(Continued)

*Primary Examiner* — Evren Seven
(74) *Attorney, Agent, or Firm* — WHDA, LLP

(57) ABSTRACT

The present application discloses a display substrate. The display substrate may include a base substrate and a plurality of light emitting structures on the base substrate. Each of the plurality of the light emitting structures includes a first electrode, a light emitting layer, a transparent electrode, an optical adjustment layer and a second electrode, arranged along a direction away from the base substrate. Optical thicknesses of optical adjustment layers in at least two of the plurality of light emitting structures are different.

16 Claims, 4 Drawing Sheets

(51) Int. Cl.

| | |
|---|---|
| ***H10K 50/858*** | (2023.01) |
| ***H10K 59/38*** | (2023.01) |
| ***H10K 59/122*** | (2023.01) |
| ***H10K 71/00*** | (2023.01) |
| ***H10K 71/13*** | (2023.01) |
| ***H10K 102/00*** | (2023.01) |

(52) U.S. Cl.
CPC ........... *H10K 59/122* (2023.02); *H10K 59/38* (2023.02); *H10K 71/00* (2023.02); *H10K 71/135* (2023.02); *H10K 2102/351* (2023.02)

(56) References Cited

U.S. PATENT DOCUMENTS

| | | | | |
|---|---|---|---|---|
| 2010/0052524 | A1 | 3/2010 | Kinoshita | |
| 2012/0119239 | A1 | 5/2012 | Kim et al. | |
| 2014/0110701 | A1 | 4/2014 | Noh | |
| 2017/0365646 | A1 | 12/2017 | Bai et al. | |
| 2018/0108869 | A1* | 4/2018 | Maeda | ................ H01L 27/3248 |
| 2018/0247981 | A1 | 8/2018 | Yamaoka et al. | |
| 2019/0189713 | A1 | 6/2019 | Kondo | |
| 2019/0237524 | A1 | 8/2019 | Chen et al. | |

FOREIGN PATENT DOCUMENTS

| | | | |
|---|---|---|---|
| CN | 105070739 | A | 11/2015 |
| CN | 103928495 | * | 7/2016 |
| CN | 107275512 | A | 10/2017 |
| CN | 107403878 | A | 11/2017 |
| CN | 108400146 | A | 8/2018 |
| CN | 108598107 | A | 9/2018 |
| CN | 109728198 | A | 5/2019 |
| CN | 109817832 | A | 5/2019 |
| TW | 201417266 | A | 5/2014 |

OTHER PUBLICATIONS

"Studying the Properties of RF-Sputtered Nanocrystalline Tin-Doped Indium Oxide" by Kashyout et al. (Year: 2011).*

Office Action dated Apr. 30, 2021, issued in counterpart CN Application No. 201980000892.6, with English Translation. (22 pages).

Office Action dated Nov. 19, 2021, issued in counterpart to CN Application No. 201980000892.6, with English Translation. (24 pages).

International Search Report dated Mar. 25, 2020, issued in counterpart Application No. PCT/CN2019/092536. (9 pages).

* cited by examiner

DISPLAY SUBSTRATE, METHOD FOR MANUFACTURING DISPLAY SUBSTRATE, AND DISPLAY APPARATUS

TECHNICAL-FIELD

The present disclosure relates generally to the field of display technology, more particularly, to a display substrate, a display apparatus, and a method of fabricating a display substrate.

BACKGROUND

Organic light-emitting diode (OLED) has become very popular in display technology. Organic light-emitting diode (OLED) is a type of organic thin film electroluminescent component, and has advantages such as simple manufacturing process, low cost, high luminous efficiency, and capability of forming flexible structures.

Different organic electroluminescent materials are used in association with different color fillets for different emissive layers. Sub-pixel regions with different colors can be constructed using different organic electroluminescent materials for each of the emissive layers in the sub-pixel regions of the pixels of the OLED devices. For example, a first organic electroluminescent material emits a peak red wavelength, a second organic electroluminescent material emits a peak green wavelength, a third organic electroluminescent material emits a peak blue wavelength and a fourth organic electroluminescent material emits a broad spectrum of wavelengths or white light. In this example, a red filter is used in association with the first organic electroluminescent material that emits a peak red wavelength, a green filter is used in association with the second organic electroluminescent material that emits a peak green wavelength, a blue filter is used in association with the third organic electroluminescent material that emits a peak blue wavelength. However, the luminance output efficiency of the OLED needs to be improved.

SUMMARY

In one aspect, the present disclosure provides a display substrate, including: a base substrate; and a plurality of light emitting structures on the base substrate, each of the plurality of light emitting structures including a first electrode, a light emitting layer, a transparent electrode, an optical adjustment layer and a second electrode, arranged along a direction away from the base substrate. Optical thicknesses of optical adjustment layers in at least two of the plurality of light emitting structures are different.

In some embodiments of the present disclosure, physical thicknesses of the optical adjustment layers in at least two of the plurality of light emitting structures are different.

In some embodiments of the present disclosure, indexes of refraction of the optical adjustment layers in at least two of the plurality of light emitting structures are different.

In some embodiments of the present disclosure, the plurality of light emitting structures comprises a first light emitting structure, a second light emitting structure and a third emitting structure; the first light emitting structure, the second light emitting structure and the third emitting structure have a first optical adjustment layer, a second optical adjustment layer and a third optical adjustment layer, respectively.

In some embodiments of the present disclosure, a physical thickness of the first optical adjustment layer is d1, a physical thickness of the second optical adjustment layer is d2, a physical thickness of the third optical adjustment layer is d3, and $0<d1\leq d2<d3$.

In some embodiments of the present disclosure, an index of refraction of the first optical adjustment layer is r1, an index of refraction of the second optical adjustment layer is r2, an index of refraction of the third optical adjustment layer is r3, and $0<r1\leq r2<r3$.

In some embodiments of the present disclosure, the optical adjustment layer comprises at least one of hexamethyldisiloxane or PEDOT:PSS.

In some embodiments of the present disclosure, the display substrate comprises a color filter on a side of the second electrode opposite from the base substrate.

In some embodiments of the present disclosure, the first optical adjustment layer, the second optical adjustment layer and the third optical adjustment layer comprise a first color photoresist, a second color photoresist, and a third color photoresist, respectively.

In some embodiments of the present disclosure, the display substrate further comprises a pixel defining layer defining a plurality of openings; at least a part of the light emitting layer is in one of the plurality of openings.

In some embodiments of the present disclosure, a first thickness of the pixel defining layer between the first light emitting structure and the second light emitting structure is smaller than a second thickness of the pixel defining layer between the second light emitting structure and the third light emitting structure.

In some embodiments of the present disclosure, transparent electrodes of at least two of the plurality of light emitting structures are connected.

In some embodiments of the present disclosure, the second electrode and the transparent electrode are connected.

In some embodiments of the present disclosure, the second electrode comprises at least one of Mg or Ag materials; and a thickness of the second electrode is in a range from about 60 Å to about 140 Å.

In some embodiments of the present disclosure, the first electrode is a reflective electrode.

In another aspect, the present disclosure provides a method for manufacturing a display substrate comprising: forming a plurality of light emitting structures. Forming the plurality of light emitting structures comprises forming a first electrode on a base substrate; forming a light emitting layer on the first electrode; forming a transparent electrode on the light emitting layer; forming an optical adjustment layer on the transparent electrode; and forming a second electrode on the optical adjustment layer. Optical thicknesses of optical adjustment layers in at least two of the plurality of light emitting structures are different.

In some embodiments of the present disclosure, forming the optical adjustment layer on the transparent electrode is performed by inkjet printing process.

In some embodiments of the present disclosure, physical thicknesses of the optical adjustment layers in at least two of the plurality of light emitting structures are different.

In some embodiments of the present disclosure, the plurality of light emitting structures comprises a first light emitting structure, a second light emitting structure and a third emitting structure; the first light emitting structure, the second light emitting structure and the third emitting structure have a first optical adjustment layer, a second optical adjustment layer and a third optical adjustment layer, respectively; the first optical adjustment layer, the second optical adjustment layer and the third optical adjustment layer comprise a first color photoresist, a second color photoresist, and a third color photoresist, respectively.

In another aspect, the present disclosure provides a display apparatus comprising any one of the display substrate above.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
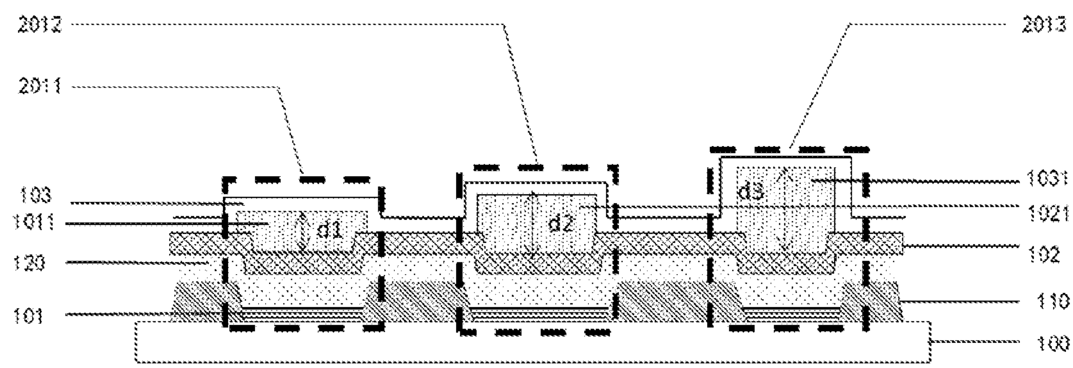
FIG. 1 is a schematic diagram illustrating the structure of a display substrate according to some embodiments of the present disclosure.

In order to clearly illustrate various embodiments in the invention disclosed herein, the following are accompanying drawings in the description of the embodiments, which are introduced briefly herein. The present disclosure will be described in further detail with reference to the accompanying drawings and embodiments in order to provide a better understanding by those skilled in the art of the technical solutions of the present disclosure. Throughout the description of the disclosure, reference is made to FIGS. 1-6. When referring to the figures, like structures and elements shown throughout are indicated with like reference numerals.

It is noted that these drawings shall be regarded to represent only some, but not all, of the embodiments of the present disclosure. For those skilled in the art, other embodiments may become apparent based on the structures as illustrated in these accompanying drawings.

A numerical value modified by "about" or "substantially" herein means that the numerical value can vary by 10% thereof In some embodiments, the present disclosure provides a display substrate, including a base substrate and a plurality of light emitting structures on the base substrate. Each of the light emitting structures includes a first electrode, a light emitting layer, a transparent electrode, an optical adjustment layer and a second electrode, which are arranged along a direction away from the base substrate. Furthermore, optical thicknesses of optical adjustment layers in at least two of the plurality of light emitting structures are different. The display substrate provided in some embodiments of the present disclosure can adjust micro-cavity length of the light emitting structures and accordingly resonance frequencies of the micro-cavities so that the light extraction efficiency or luminance output of the light emitting structures could be significantly improved.

Herein, the "micro-cavity" can be formed between two reflective electrodes. In a micro-cavity device such as an OLED micro-cavity device, the organic light emitting layer may be disposed between two reflective electrodes.

Herein, "micro-cavity length" means an optical thickness between the two reflective electrodes.

Herein, "reflective" means at least 30% light reflectivity. For example, herein, the light reflectivity could be 40%, 50%, 60%, 70%, 80%, 90%, 95%, or substantially 100% etc.

Herein, "transparent" means more than 50% light transmittance. For example, herein, the light transmittance could be 60%, 70%, 80%, 90%, 95%, or substantially 100% etc.

As illustrate in FIG. 1, in some embodiments, the present disclosure provides a display substrate, including a base substrate 100 and a plurality of light emitting structures (2011, 2012, 2013) on the base substrate 100. Each of the light emitting structures (2011, 2012, 2013) includes a first electrode 101, a light emitting layer 120, a transparent electrode 102, an optical adjustment layer (1011, or 1021, or 1031) and a second electrode 103, arranged along a direction away from the base substrate 100. Optical thicknesses of optical adjustment layers (1011, 1021,1031) in at least two of the plurality of light emitting structures (2011, 2012, 2013) are different.

In some embodiments, the plurality of light emitting structures comprises a first light emitting structure 2011, a second light emitting structure 2012 and a third emitting structure 2013. The first light emitting structure 2011, the second light emitting structure 2012 and the third emitting structure 2013 have a first optical adjustment layer 1011, a second optical adjustment layer 1021 and a third optical adjustment layer 1031, respectively.

In some embodiments, the optical thicknesses of optical adjustment layers (1011, 1021, 1031) in at least two of the plurality of light emitting structures (2011, 2012, 2013) are different. For instance, an optical thickness of the first optical adjustment layer 1011 is different from an optical thickness of the second optical adjustment layer 1021; or the optical thickness of the second optical adjustment layer 1021 is different from an optical thickness of the third optical adjustment layer 1031; or the optical thickness of the first optical adjustment layer 1011, the optical thickness of the second optical adjustment layer 1021 and the optical thickness of the third optical adjustment layer 1031 are different from one another.

Herein, an "optical thickness" means a result of a physical thickness multiplying by an index of refraction.

In some embodiments, the first optical adjustment layer 1011, the second optical adjustment layer 1021 and the third optical adjustment layer 1031 are made of same material and the physical thicknesses of the optical adjustment layers (1011, 1021, 1031) in at least two of the plurality of light emitting structures (2011, 2012, 2013) are different. "Physical thickness" herein means a length measured in a direction perpendicular to the base substrate.

In some embodiments, the first optical adjustment layer 1011, the second optical adjustment layer 1021 and the third optical adjustment layer 1031 are made of different material and the physical thicknesses of the optical adjustment layers (1011, 1021, 1031) in at least two of the plurality of light emitting structures (2011, 2012, 2013) are the same.

In some embodiments, the physical thicknesses of the optical adjustment layers (1011, 1021, 1031) in at least two of the plurality of light emitting structures (2011, 2012, 2013) could be different and/or the indexes of refraction of the optical adjustment layers (1011, 1021, 1031) in at least two of the plurality of light emitting structures (2011, 2012, 2013) could be different.

In some embodiments, physical thicknesses of the optical adjustment layers (1011, 1021, 1031) in at least two of the plurality of light emitting structures (2011, 2012, 2013) are different. For example, an physical thickness of the first optical adjustment layer 1011 is different from an physical thickness of the second optical adjustment layer 1021; or the physical thickness of the second optical adjustment layer 1021 is different from an physical thickness of the third optical adjustment layer 1031; or the physical thickness of the first optical adjustment layer 1011, the physical thickness of the second optical adjustment layer 1021 and the physical thickness of the third optical adjustment layer 1031 are different from one another.

In some embodiments, as shown in FIG. 1, the physical thickness of the first optical adjustment layer is d1, the physical thickness of the second optical adjustment layer is d2, the physical thickness of the third optical adjustment layer is d3, and $0<d1\leq d2<d3$.

In some embodiments, indexes of refraction of the optical adjustment layers in at least two of the plurality of light emitting structures are different. For example, the index of fraction of the first optical adjustment layer 1011 is different from the index of fraction of the second optical adjustment layer 1021; or the index of fraction of the second optical adjustment layer 1021 is different from the index of fraction of the third optical adjustment layer 1031; or the index of fraction of the first optical adjustment layer 1011, the index of fraction of the second optical adjustment layer 1021, and the index of fraction of the third optical adjustment layer 1031 are different from one another.

In some embodiments, an index of refraction of the first optical adjustment layer is r1, an index of refraction of the second optical adjustment layer is r2, an index of refraction of the third optical adjustment layer is r3, and $0<r1\leq r2<r3$.

In some embodiments, the optical adjustment layer is made of transparent material, for example, transparent resins such as epoxy resin etc.

In some embodiments, the optical adjustment layer includes at least one of hexamethyldisiloxane (HDMS) or PEDOT:PSS (poly(3,4-ethylenedioxythiophene): polystyrene sulfonate).

Figure 2:
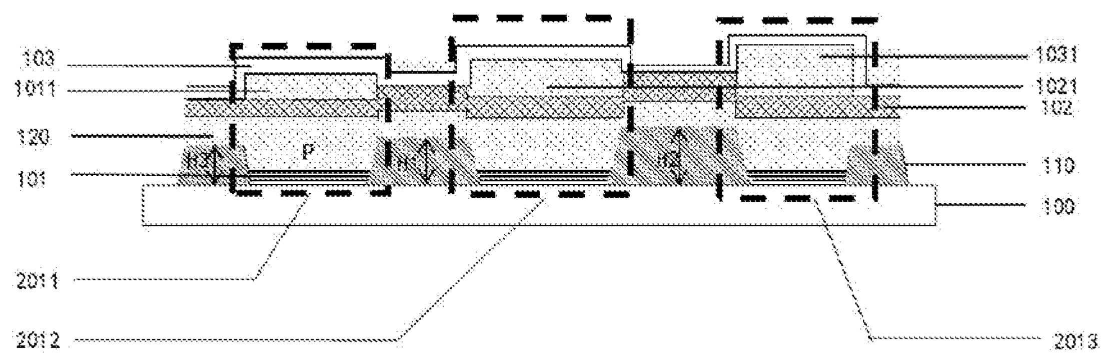
FIG. 2 is a schematic diagram illustrating the structure of a display substrate according to some embodiments of the present disclosure.

As illustrated in FIG. 2, in some embodiments, the display substrate further comprises a pixel defining layer 110. The pixel defining layer 110 defines a plurality of openings P. At least a part of the light emitting layer 120 is located in one of the plurality of openings P.

In some embodiments, the plurality of light emitting structures is arranged in an array. For example, the first light emitting structures 2011, the second light emitting structures 2012 and the third light emitting structures 2013 are arranged in an array.

In some embodiments, a first thickness H1 of the pixel defining layer 110 between the first light emitting structure 2011 and the second light emitting structure 2012 is smaller than a second thickness H2 of the pixel defining layer 110 between the second light emitting structure 2012 and the third light emitting structure 2013. As such, the display substrate provided in the embodiments of the present disclosure can have reduced height difference between a surface of the transparent electrode 102 opposite from the base substrate 100 and a surface of the optical adjustment layer opposite from the base substrate 100, thereby reducing cracks in the second electrode 103 which is located on the optical adjustment layers and the transparent electrode 102.

In some embodiments of the present disclosure, an orthographic projection of a first portion (not shown in the figures) of the pixel defining layer 110 on the base substrate 100 is between an orthographic projection of the first optical adjustment layer 1011 on the base substrate 100 and an orthographic projection of the second optical adjustment layer 1021 on the base substrate 100. An orthographic projection of a second portion (not shown in the figures) of the pixel defining layer 110 on the base substrate 100 is between the orthographic projection of the second optical adjustment layer 1021 on the base substrate and an orthographic projection of a third optical adjustment layer 1031 on the base substrate 100. As shown in FIG. 2, a thickness of the first portion of the pixel defining layer 110 is the first thickness H1, a thickness of the second portion of the pixel defining layer 110 is the second thickness H2, and H1<H2.

In some embodiments of the present disclosure, a third thickness H3 of the pixel defining layer 110 between the third light emitting structure 2013 and the first light emitting structure 2011 is smaller than the first thickness H1.

In some embodiments of the present disclosure, an orthographic projection of a third portion (not shown in the figures) of the pixel defining layer 110 on the base substrate 100 is between the orthographic projection of the first optical adjustment layer 1011 on the base substrate and an orthographic projection of a third optical adjustment layer 1031 on the base substrate 100. A thickness of the third portion of the pixel defining layer 110 is the third thickness H3, and H3<H1.

In some embodiments of the present disclosure, the first optical adjustment layer 1011, the second optical adjustment layer 1021 and the third optical adjustment layer 1031 comprise a first color photoresist, a second color photoresist, and a third color photoresist, respectively. For instance, the first color photoresist, the second color photoresist, and the third color photoresist are a green color photoresist, a blue color photoresist, and a red color photoresist, respectively. As such, the optical adjustment layers can be used as color filters so that there is no need to add extra color filters on the second electrode 103.

In some embodiments of the present disclosure, the material of the first color photoresist, the second color photoresist, and the third color photoresist may include epoxy resin, diazonaphthoquinone (DNQ) or novolac resin.

Figure 3:
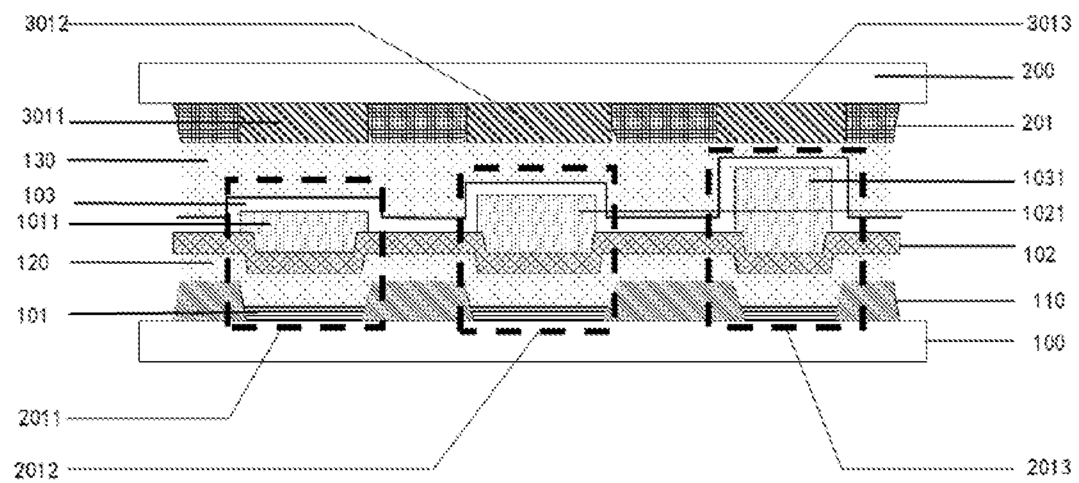
FIG. 3 is a schematic diagram illustrating the structure of a display substrate according to some embodiments of the present disclosure.
Figure 4:
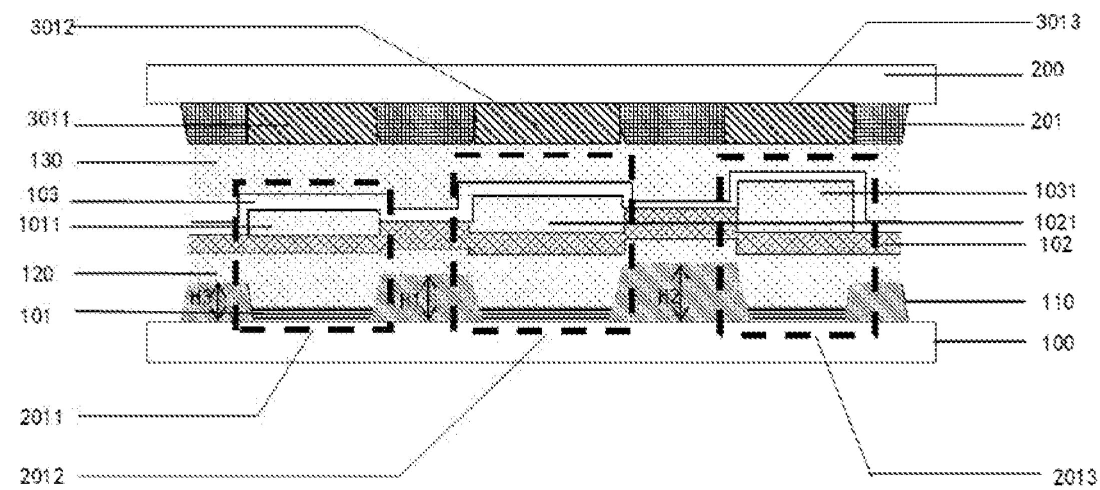
FIG. 4 is a schematic diagram illustrating the structure of a display substrate according to some embodiments of the present disclosure.

As illustrated in FIG. 3 and FIG. 4, in some embodiments of the present disclosure, the display substrate comprises a color filter on a side of the second electrode 103 opposite from the base substrate 100. For example, the color filter includes different color filter units such as a green color filter unit 3011, a blue color filter unit 3012, a red color filter unit 3013 and a black matrix 201.

In some embodiments of the present disclosure, the light emitting layer 120 could be a white emitting layer. In one embodiment, the white emitting layer includes a red emitting layer, a blue emitting layer and a green emitting layer arranged along with a direction vertical to the base substrate.

As illustrate in FIG. 1 and FIG. 2, in some embodiments of the present disclosure, transparent electrodes 102 of at least two of the plurality of light emitting structures are connected. For example, a transparent electrode 102 of the first light emitting structure 2011 is connected with a transparent electrode 102 of the second light emitting structure 2012.

Optionally, in some embodiments of the present disclosure, transparent electrodes 102 of the plurality of light emitting structures are connected with each other.

In some embodiments of the present disclosure, the second electrode 103 and the transparent electrode 102 are connected.

In some embodiments of the present disclosure, the second electrode 103 and the transparent electrode 102 are contacted. For example, a portion of the second electrode 103 contacting the transparent electrode 102 is between the first optical adjustment layer 1011 and the second optical adjustment layer 1021, or between the second optical adjustment layer 1021 and the third optical adjustment layer 1031.

In some embodiments of the present disclosure, the second electrode 103 comprises at least one of Mg or Ag materials; and a thickness of the second electrode 103 is in a range from about 60 Å to about 140 Å. For example, the thickness of the second electrode 103 is about 70 Å, 80 Å, 90 Å, 100 Å, 110 Å, 120 Å, or 130 Å.

In some embodiments of the present disclosure, the second electrode 103 could be a cathode of a light emitting structure.

In some embodiments of the present disclosure, the first electrode 101 is a reflective electrode.

Herein, "reflective" means at least 30% light reflectivity. For example, herein, the light reflectivity could be 40%, 50%, 60%, 70%, 80%, 90%, 95%, or substantially 100% etc.

In some embodiments of the present disclosure, the first electrode 101 could be an anode of the light emitting structure.

In some embodiments of the present disclosure, the first electrode 101 includes two transparent electrodes and a reflective electrode between the two transparent electrodes. In one embodiment, the first electrode includes a first transparent electrode, a reflective electrode and a second transparent electrode arranged in a vertical direction. For example, the material of the first transparent electrode can be selected from Indium tin oxide (ITO) or Indium zinc oxide (IZO), or other transparent electrode materials. The material of the second transparent electrode material can be selected from Indium tin oxide (ITO) or Indium zinc oxide (IZO), or other transparent electrode materials. The material of the reflective electrode includes at least one of Mg or Ag materials or other reflective materials to reflect the light.

In some embodiments of the present disclosure, the physical thickness d1 of the first optical adjustment layer 1011 is in a range of about 20 nm to about 60 nm. For example, d1 is about 30 nm, about 40 nm, or about 50 nm. The physical thickness d2 of the second optical adjustment layer 1021 is in a range of about 80 nm to about 100 nm. For example, d2 is about 90 nm or about 95 nm. The physical thickness d3 of the third optical adjustment layer 1031 is in a range of about 100 nm to about 120 nm. For example, d3 is about 105 nm, about 110 nm, or about 115 nm.

In some embodiments of the present disclosure, the micro-cavity length of the first light emitting structure 2011 is in a range of about 390 nm to about 430 nm, such as about 400 nm, about 410 nm, or about 420 nm; the micro-cavity length of the second light emitting structure 2012 is in a range of about 440 nm to about 470 nm, such as about 450 nm or about 460 nm; the micro-cavity length of the third light emitting structure 2013 is in a range of about 470 nm to about 500 nm, such as about 480 nm or about 490 nm. Optionally, light extraction efficiency of the light emitting structures according to one embodiment of the present disclosure is shown in table1. The light extraction efficiency or luminance output of light emitting structures is significantly improved.

TABLE 1 the light extraction efficiency of one embodiment

| Light emitting structure | Microcavity length (nm) | Thickness of optical adjustment layer (nm) | Efficiency (cd/A) | CIE x, y |
|---|---|---|---|---|
| R | 480 | 110 | 30 | (0.313, 0.206) |
| G | 410 | 40 | 61 | (0.248, 0.584) |
| B | 460 | 90 | 42 | (0.295, 0.223) |

In another aspect, the present disclosure provides a method for manufacturing a display substrate including forming a plurality of light emitting structures. Forming the plurality of light emitting structures comprises forming a first electrode on a base substrate; forming a light emitting layer on the first electrode; forming a transparent electrode on the light emitting layer; forming an optical adjustment layer on the transparent electrode; and forming a second electrode on the optical adjustment layer. Optical thicknesses of optical adjustment layers in at least two of the plurality of light emitting structures are different.

Figure 5:
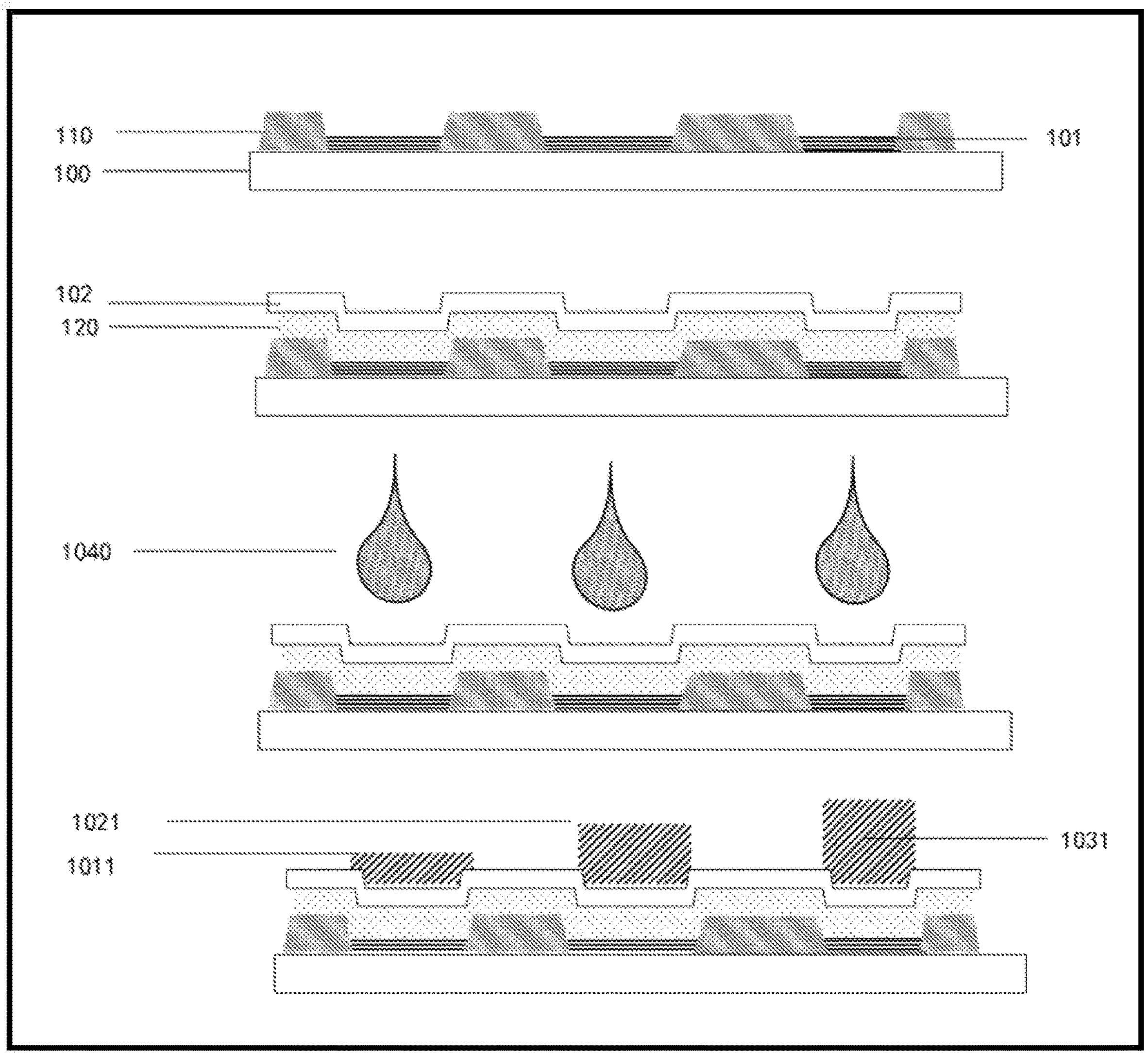
FIG. 5 illustrates a method of fabricating a display substrate according to some embodiments of the present disclosure.
Figure 6:
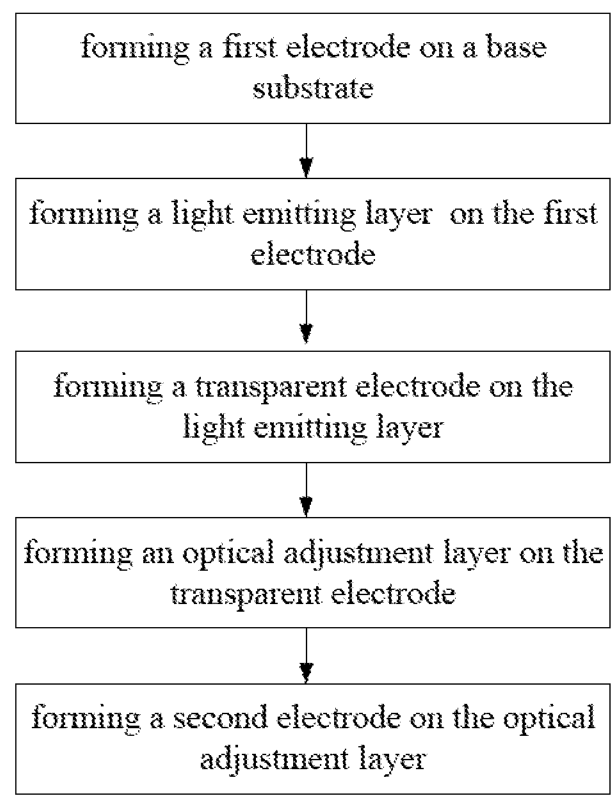
FIG. 6 is a flow chart for fabricating a display substrate according to some embodiments of the present disclosure.

As illustrated in FIG. 5 in some embodiments of the present disclosure, the method for manufacturing a display substrate includes Step 1 to Step 6.

Step 1 includes forming a plurality of first electrodes 101 on a base substrate 100.

Step 2 includes forming a pixel defining layer 110 defining a plurality of openings on the base substrate 100. The plurality of the first electrodes 101 is located in the plurality of openings respectively.

Step 3 includes forming a light emitting layer 120 on the first electrode 101.

Step 4 includes forming a transparent electrode 102 on the light emitting layer 120.

Step 5 includes forming an optical adjustment layer on the transparent electrode 102.

Step 6 includes forming a second electrode 103 on the optical adjustment layer.

In some embodiments of the present disclosure, the step 2 includes forming a first electrode material layer on the base substrate 100 by a method such as a sputtering method, followed by patterning the first electrode material layer to form the first electrodes 101.

In some embodiments of the present disclosure, the step 2 includes forming a pixel defining material layer on the first electrode 101, followed by patterning the pixel defining material layer to form the pixel defining layer 110.

In some embodiments of the present disclosure, the step 3 includes forming a light emitting layer 120 by an evaporation method.

In some embodiments of the present disclosure, the step 3 includes forming a light emitting layer 120 by an inkjet printing method.

In some embodiments of the present disclosure, the step 4 includes forming a transparent electrode 102 on the light emitting layer 120 by a sputtering method.

In some embodiments of the present disclosure, the transparent electrode includes ITO or IZO.

In some embodiments of the present disclosure, forming the optical adjustment layer on the transparent electrode is performed by an inkjet printing process. In one embodiment, a solution 1040 including materials of the optical adjustment layer is printed on the transparent electrode 102, and then the solution 1040 is dried to form the optical adjustment layers.

In some embodiments of the present disclosure, printing the solution 1040 on the transparent electrode 102 includes controlling a liquid volume during the inkjet printing process to form different thicknesses of the optical adjustment layers.

In some embodiments of the present disclosure, physical thicknesses of the optical adjustment layers in at least two of the plurality of light emitting structures are different.

In some embodiments of the present disclosure, the plurality of light emitting structures comprises a first light emitting structure 2011, a second light emitting structure 2012 and a third emitting structure 2013. The first light emitting structure 2011, the second light emitting structure 2012 and the third emitting structure 2013 have a first optical adjustment layer 1011, a second optical adjustment layer 1021 and a third optical adjustment layer 1031, respectively. The first optical adjustment layer 1011, the second optical adjustment layer 1021 and the third optical adjustment layer 1031 comprise a first color photoresist material, a second color photoresist material, and a third color photoresist material, respectively.

In some embodiments of the present disclosure, the first color photoresist material, the second color photoresist material, and the third color photoresist material include a green photoresist material, a blue photoresist material, and a red photoresist material, respectively. As such, the optical adjustment layers can be used as color filters so that there is no need to add extra color filters on the second electrodes 103.

In some embodiments of the present disclosure, the method further includes forming a planarization layer 130 on the second electrodes 103.

In some embodiments of the present disclosure, the method further includes forming a color filter on the planarization layer 130, such as forming the green color filter unit 3011, the blue color filter unit 3012, the red color filter unit 3013 and the black matrix 201 on the planarization layer 130.

In another aspect, the present disclosure provides a display apparatus comprising the display substrate of any one of the embodiments above.

In some embodiments of the present disclosure, the display apparatus can include an encasing substrate 200 to encase the display substrate.

In some embodiments of the present disclosure, the light emitting layer 120 could include a plurality of organic functional layers arranged in each of the openings A. For example, the plurality of organic functional layers is in a stacked arrangement on the base substrate 100. In one embodiment, the light emitting layer 120 includes a hole injection layer, a hole transport layer, an organic electroluminescent material layer, an electron transport layer, and an electron injection layer.

In some embodiments of the present disclosure, the display apparatus, or more specifically, the organic electroluminescent diode display apparatus, can comprise other conventional structures such as a power supply unit or a display driving unit, etc. These conventional structures are well-known to people of ordinary skill in the field, and their description thereof is not described herein.

The display apparatus can be any electronic products or components that have a display function such as a mobile phone, a tablet, a television, a monitor, a laptop, a digital frame, or a navigator.

Although specific embodiments have been described above in detail, the description is merely for purposes of illustration. It should be appreciated, therefore, that many aspects described above are not intended as required or essential elements unless explicitly stated otherwise.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its practical application, thereby enabling persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims Moreover, these claims may refer to use "first,", "second," etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:

a base substrate; and a plurality of light emitting structures on the base substrate, each of the plurality of light emitting structures including a first electrode, a light emitting layer, a transparent electrode, an optical adjustment layer and a second electrode, arranged along a direction away from the base substrate;

wherein optical thicknesses of optical adjustment layers in at least two of the plurality of light emitting structures are different, and indexes of refraction of the optical adjustment layers in at least two of the plurality of light emitting structures are different;

the first optical adjustment layer, the second optical adjustment layer and the third optical adjustment layer comprise a first color photoresist, a second color photoresist, and a third color photoresist, respectively, and the first color photoresist, the second color photoresist, and the third color photoresist are different colored photoresists;

the plurality of light emitting structures comprises a first light emitting structure, a second light emitting structure and a third emitting structure; the first light emitting structure, the second light emitting structure and the third emitting structure have a first optical adjustment layer, a second optical adjustment layer and a third optical adjustment layer, respectively;

a physical thickness of the first optical adjustment layer is d1, a physical thickness of the second optical adjustment layer is d2, a physical thickness of the third optical adjustment layer is d3, and $0<d1\leq d2<d3$;

the display substrate further comprises a pixel defining layer defining a plurality of openings; at least a part of the light emitting layer is in one of the plurality of openings; and a first thickness of the pixel defining layer between the first light emitting structure and the second light emitting structure is smaller than a second thickness of the pixel defining layer between the second light emitting structure and the third light emitting structure.

2. The display substrate of claim 1, wherein physical thicknesses of the optical adjustment layers in at least two of the plurality of light emitting structures are different.

3. A display substrate, comprising:

a base substrate; and a plurality of light emitting structures on the base substrate, each of the plurality of light emitting structures including a first electrode, a light emitting layer, a transparent electrode, an optical adjustment layer and a second electrode, arranged along a direction away from the base substrate;

wherein optical thicknesses of optical adjustment layers in at least two of the plurality of light emitting structures are different;

the plurality of light emitting structures comprises a first light emitting structure, a second light emitting structure and a third emitting structure; the first light emitting structure, the second light emitting structure and the third emitting structure have a first optical adjustment layer, a second optical adjustment layer and a third optical adjustment layer, respectively;

the first light emitting structure, the second light emitting structure and the third emitting structure emit a green color, a blue color, and a red color, respectively;

a physical thickness of the first optical adjustment layer is d1, a physical thickness of the second optical adjustment layer is d2, a physical thickness of the third optical adjustment layer is d3, and $0<d1\leq d2<d3$; and the first optical adjustment layer, the second optical adjustment layer and the third optical adjustment layer comprise a first color photoresist, a second color photoresist, and a third color photoresist, respectively, and the first color photoresist, the second color photoresist, and the third color photoresist are different colored photoresists.

4. The display substrate of claim 3, wherein an index of refraction of the first optical adjustment layer is r1, an index of refraction of the second optical adjustment layer is r2, an index of refraction of the third optical adjustment layer is r3, and $0<r1\leq r2<r3$.

5. The display substrate of claim 1, wherein the optical adjustment layer comprises at least one of hexamethyldisiloxane or PEDOT:PSS.

6. The display substrate of claim 1, wherein the display substrate comprises a color filter on a side of the second electrode opposite from the base substrate.

7. The display substrate of claim 3, wherein the display substrate further comprises a pixel defining layer defining a plurality of openings; at least a part of the light emitting layer is in one of the plurality of openings.

8. The display substrate of claim 3, wherein a first thickness of the pixel defining layer between the first light emitting structure and the second light emitting structure is smaller than a second thickness of the pixel defining layer between the second light emitting structure and the third light emitting structure.

9. The display substrate of claim 1, wherein transparent electrodes of at least two of the plurality of light emitting structures are connected.

10. The display substrate of claim 1, wherein the second electrode and the transparent electrode are connected.

11. The display substrate of claim 1, wherein the second electrode comprises at least one of Mg or Ag materials; and a thickness of the second electrode is in a range from about 60 Å to about 140 Å.

12. The display substrate of claim 1, wherein the first electrode is a reflective electrode.

13. A method for manufacturing a display substrate, comprising:

forming a plurality of light emitting structures;

wherein forming the plurality of light emitting structures comprises forming a first electrode on a base substrate;

forming a light emitting layer on the first electrode;

forming a transparent electrode on the light emitting layer;

forming an optical adjustment layer on the transparent electrode; and forming a second electrode on the optical adjustment layer;

wherein optical thicknesses of optical adjustment layers in at least two of the plurality of light emitting structures are different, and indexes of refraction of the optical adjustment layers in at least two of the plurality of light emitting structures are different; and wherein the plurality of light emitting structures comprises a first light emitting structure, a second light emitting structure and a third emitting structure; the first light emitting structure, the second light emitting structure and the third emitting structure have a first optical adjustment layer, a second optical adjustment layer and a third optical adjustment layer, respectively;

the first light emitting structure, the second light emitting structure and the third emitting structure emit a green color, a blue color, and a red color, respectively;

a physical thickness of the first optical adjustment layer is d1, a physical thickness of the second optical adjustment layer is d2, a physical thickness of the third optical adjustment layer is d3, and $0<d1\leq d2<d3$; and the first optical adjustment layer, the second optical adjustment layer and the third optical adjustment layer comprise a first color photoresist, a second color photoresist, and a third color photoresist, respectively; and the first color photoresist, the second color photoresist, and the third color photoresist are different colored photoresists.

14. The method of claim 13, wherein forming the optical adjustment layer on the transparent electrode is performed by inkjet printing process.

15. The method of claim 13, wherein physical thicknesses of optical adjustment layers in at least two of the plurality of light emitting structures are different.

16. A display apparatus, comprising:

the display substrate of claim 1.

* * * * *